(12) United States Patent
Choi et al.

(10) Patent No.: US 9,871,180 B2
(45) Date of Patent: Jan. 16, 2018

(54) THERMOELECTRIC MATERIAL AND THERMOELECTRIC DEVICE INCLUDING THE SAME

(71) Applicant: Samsung Electronics Co., Ltd., Suwon-Si, Gyeonggi-Do (KR)

(72) Inventors: Jae-young Choi, Suwon-si (KR); Seung-hyun Baik, Seoul (KR); Won-young Kim, Suwon-si (KR); Dae-woo Suh, Seoul (KR); Sang-hoon Lee, Suwon-si (KR); Seung-hyun Hong, Seoul (KR)

(73) Assignees: Samsung Electronics Co., Ltd., Gyeonggi-do (KR); Sungkyunkwan University Foundation for Corporate Collaboration, Gyeonggi-do (KR)

( * ) Notice: Subject to any disclaimer, the term of this patent is extended or adjusted under 35 U.S.C. 154(b) by 210 days.

(21) Appl. No.: 14/096,560

(22) Filed: Dec. 4, 2013

(65) Prior Publication Data

US 2014/0182646 A1  Jul. 3, 2014

(30) Foreign Application Priority Data

Dec. 31, 2012 (KR) .................. 10-2012-0158529

(51) Int. Cl.
*H01L 35/26* (2006.01)
*H01L 35/18* (2006.01)
(Continued)

(52) U.S. Cl.
CPC .............. *H01L 35/26* (2013.01); *H01L 35/02* (2013.01); *H01L 35/16* (2013.01); *H01L 35/18* (2013.01);
(Continued)

(58) Field of Classification Search
CPC ......... H01L 35/26; H01L 35/02; H01L 35/04; H01L 35/10
See application file for complete search history.

(56) References Cited

U.S. PATENT DOCUMENTS 7,554,192 B2   6/2009  Koga et al.
8,216,672 B2   7/2012  Smith et al.
(Continued)

FOREIGN PATENT DOCUMENTS

KR   10-0650092 B1    11/2006
KR   20120029864 A    3/2012
(Continued)

OTHER PUBLICATIONS

Bandaru, Prabhakar R.; Electrical Properties and Applications of Carbon Nanotube Structures; Journal of Nanoscience and Nanotechnology; vol. 7; 2007; pp. 1-29.*
(Continued)

*Primary Examiner* — Jeffrey T Barton
*Assistant Examiner* — Edward Schmiedel
(74) *Attorney, Agent, or Firm* — Harness, Dickey & Pierce, P.L.C.

(57) ABSTRACT

A thermoelectric material includes a stack structure including alternately stacked first and second material layers. The first material layer may include a carbon nano-material. The second material layer may include a thermoelectric inorganic material. The first material layer may include a thermoelectric inorganic material in addition to the carbon nano-material. The carbon nano-material may include, for example, graphene. At least one of the first and second material layers may include a plurality of nanoparticles. The thermoelectric material may further include at least one conductor extending in an out-of-plane direction of the stack structure.

21 Claims, 9 Drawing Sheets (51) Int. Cl.
*H01L 35/02* (2006.01)
*H01L 35/24* (2006.01)
*H01L 35/16* (2006.01)
*B82Y 99/00* (2011.01)
*H01L 35/14* (2006.01)
*H01L 35/12* (2006.01)

(52) U.S. Cl.
CPC .............. *H01L 35/24* (2013.01); *B82Y 99/00* (2013.01); *H01L 35/12* (2013.01); *H01L 35/14* (2013.01); *Y10S 977/742* (2013.01); *Y10S 977/948* (2013.01)

(56) References Cited

U.S. PATENT DOCUMENTS

| | | | |
|---|---|---|---|
| 9,070,824 B2* | 6/2015 | Choi | H01L 35/22 |
| 2002/0179135 A1* | 12/2002 | Shutoh | H01L 35/20 |
| | | | 136/200 |
| 2005/0028857 A1* | 2/2005 | Ghamaty | H01L 35/22 |
| | | | 136/204 |
| 2006/0118158 A1* | 6/2006 | Zhang | H01L 35/34 |
| | | | 136/205 |
| 2008/0128842 A1* | 6/2008 | Kenany | H01L 31/0352 |
| | | | 257/431 |
| 2010/0272993 A1* | 10/2010 | Volinsky | B82Y 10/00 |
| | | | 428/378 |
| 2011/0033746 A1 | 2/2011 | Liu et al. | |
| 2011/0155478 A1* | 6/2011 | Choi | G06F 3/041 |
| | | | 178/18.03 |
| 2012/0024332 A1* | 2/2012 | Stefan | H01L 35/32 |
| | | | 136/200 |
| 2013/0312806 A1* | 11/2013 | Carroll | H01L 35/22 |
| | | | 136/212 |
| 2014/0230868 A1* | 8/2014 | Ryu | H01L 35/22 |
| | | | 136/200 |
| 2014/0345661 A1* | 11/2014 | Roy | H01L 35/34 |
| | | | 136/201 |

FOREIGN PATENT DOCUMENTS

| | | | |
|---|---|---|---|
| KR | 10-1143524 B1 | | 5/2012 |
| WO | WO-2012054504 | * | 4/2012 |

OTHER PUBLICATIONS

Definition of Particle; Merriam-Webster Dictionary; http://www.merriam-webster.com/dictionary/particle; accessed and printed Sep. 21, 2015.*

Yoon et al, "Enhanced Condensation, Agglomeration, and Rejection of Water Vapor by Superhydrophobic Aligned Multiwalled Carbon Nanotube Membranes", ACSNANO, Jun. 25, 2012, p. 5980-5987, vol. 6 No. 7, American Chemical Society.

Miyazawa et al., "Numerical Investigation of the Influence of Material Property of a Crucible on Interface Shape in a Unidirectional Solidification Process," Crystal Growth & Design, 2009, p. 267-272, Voll 9 No. 1, American Chemical Society.

Rowe, Thermoelectrics Handbook: Macro to Nano, 2006, Taylor & Francis Group, Boca Raton, Florida.

Hong et al., "A hybridized graphene carrier highway for enyhanced thermoelectric power generation," Phys. Chem. Chem. Phys, Sep. 12, 2012, p. 13527-13531, vol. 14, the Owner Societies 2012.

* cited by examiner

THERMOELECTRIC MATERIAL AND THERMOELECTRIC DEVICE INCLUDING THE SAME

CROSS-REFERENCE TO RELATED APPLICATIONS

This application claims the benefit of Korean Patent Application No. 10-2012-0158529, filed on Dec. 31, 2012, in the Korean Intellectual Property Office, the disclosure of which is incorporated herein in its entirety by reference.

BACKGROUND

1. Field

Some example embodiments relate to thermoelectric materials and/or thermoelectric devices including the same.

2. Description of the Related Art

Thermoelectric conversion involves energy conversion between thermal energy and electric energy. When current flows through a thermoelectric material, a temperature gradient is generated between both ends of the thermoelectric material, which is called a "Peltier effect", or conversely, when a temperature difference exists between both ends of a thermoelectric material, electricity is generated, which is called a "Seebeck effect".

The Peltier effect makes it possible to realize various cooling systems which do not need a refrigerant. A cooling system using the Peltier effect may be usefully applied for solving a heat generation problem, which is difficult for existing cooling systems (e.g., manual cooling systems, or refrigerant gas compression type cooling systems) to solve. Thermoelectric cooling is an environmentally friendly cooling technique, which does not use refrigerant gas that causes environmental problems, and the scope of application of the thermoelectric cooling may expand to general-purpose cooling fields such as refrigerators, air conditioners, etc. by enhancing the thermoelectric cooling efficiency through development of a relatively high efficiency thermoelectric cooling material.

The Seebeck effect makes it possible to convert heat generated in a computer, a vehicle engine, an industrial factory, etc. to electric energy. The thermoelectric electricity generation using the Seebeck effect may be used as a new regeneration energy source. Recently, as interest in development of new energy, recovery of waste energy, environmental protection, etc. has increased, interest in thermoelectric devices has increased accordingly.

SUMMARY

Some example embodiments provide thermoelectric materials having desirable thermoelectric characteristics and/or thermoelectric devices including the same.

Other example embodiments provide thermoelectric materials having a relatively high Seebeck coefficient and relatively high electrical conductivity, and/or thermoelectric devices including the same.

Other example embodiments provide thermoelectric materials in which a thermoelectric inorganic material and a carbon nano-material (e.g., graphene) are mixed, and thermoelectric devices including the same.

Additional aspects will be set forth in part in the description which follows and, in part, will be apparent from the description, or may be learned by practice of the presented embodiments.

According to an example embodiment, a thermoelectric composite comprises a stack structure including alternately stacked first and second material layers, the first material layer containing a carbon nano-material and the second material layer containing a thermoelectric inorganic material.

The carbon nano-material may include graphene. The carbon nano-material may include graphene nanoparticles. The first material layer may further include a thermoelectric inorganic material. The thermoelectric inorganic material of the first material layer may include a plurality of nanoparticles.

The first material layer may include a composite of the carbon nano-material and the thermoelectric inorganic material. The thermoelectric inorganic material of the second material layer may include a plurality of nanoparticles.

The thermoelectric inorganic material of the second material layer may include at least one selected from the group consisting of an Sb—Te compound, a Bi—Te compound, a Bi—Sb—Te compound, a Co—Sb compound, a Pb—Te compound, a Ge—Tb compound, an Si—Ge compound, and an Sm—Co compound, for example.

The thermoelectric composite may further include at least one conductor extending in an out-of-plane direction of the first and second material layers, the at least one conductor contacting side surfaces of the first and second material layers.

The at least one conductor may have a pillar shape. The at least one conductor may include a carbon nanotube (CNT). The at least one conductor may include a multi-walled carbon nanotube (MWCNT). The at least one conductor may include a single-walled carbon nanotube (SW-CNT). The at least one conductor may include a plurality of conductors spaced apart from each other, and the stack structure may fill a space between the plurality of conductors.

According to another example embodiment, a thermoelectric device includes the above-mentioned thermoelectric composite.

The thermoelectric device may further include an electronic device connected to the stack structure. The electronic device may be electrically connected to both ends of the stack structure in an in-plane direction of the stack structure. The electronic device may be electrically connected to both ends of the stack structure in an out-of-plane direction. The electronic device may be one of an electricity consuming device, an electricity storing device, and an electricity supplying device. The thermoelectric device may be one of a thermoelectric electricity generation device, a thermoelectric cooling device, and a heat sensor.

According to another example embodiment, a thermoelectric device includes a thermoelectric material having a stack structure including alternately stacked first and second material layers, the first material layer containing a carbon nano-material and a second material layer containing a thermoelectric inorganic material, and at least one of the carbon nano-material and the thermoelectric inorganic material including a plurality of nanoparticles.

The first material layer may include a composite of the carbon nano-material and a thermoelectric inorganic material. The thermoelectric material may further include at least one conductor extending along side surfaces of the first and second material layers.

The at least one conductor may include a carbon nanotube (CNT). The at least one conductor may include a plurality of conductors spaced apart from each other, and the stack structure may fill a space between the plurality of conductors.

According to another example embodiment, a thermoelectric device includes a thermoelectric material, the thermoelectric material including a stack structure including alternately stacked first and second material layers, the first material layer and the second material layer being different from each other, and at least one conductor extending in an out-of-plane direction of the stack structure and connecting the first and second material layers to each other.

The first material layer may include a carbon nanomaterial and the second material layer may include a thermoelectric inorganic material. The first material layer may further include a thermoelectric inorganic material. The at least one conductor may include a carbon nanotube (CNT).

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, thermoelectric materials (thermoelectric composites) and thermoelectric device according to example embodiments will be described with reference to the accompanying drawings. In the drawings, the widths and thicknesses of layers and regions are exaggerated for clarity of illustration. Like reference numerals in the drawings denote like elements throughout.

Figure 1:
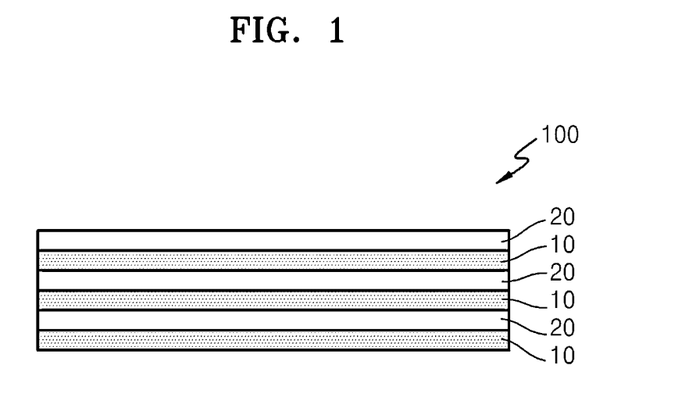
FIG. 1 is a cross-sectional view illustrating a thermoelectric composite according to an example embodiment.

FIG. 1 is a cross-sectional view illustrating a thermoelectric composite according to an example embodiment. Herein, the thermoelectric composite (thermoelectric structure) may be referred to as a "thermoelectric composite material" or a "composite thermoelectric material".

Referring to FIG. 1, the thermoelectric composite may have a structure (hereinafter referred to as "stack structure") 100 in which a first material layer 10 containing a carbon nano-material and a second material layer 20 containing a thermoelectric inorganic material are alternately stacked at least one time. The stack structure 100 may be referred to as a sandwiched composite structure.

The first material layer 10 may include, for example, graphene as the carbon nano-material. In this case, the carbon nano-material may be graphene nanoparticles. In one example, the first material layer 10 may be a layer comprised of a plurality of graphene nanoparticles. The first material layer 10 may further include a thermoelectric inorganic material as well as the carbon nano-material. In other words, the first material layer 10 may be a composite of the carbon nano-material and the thermoelectric inorganic material. In this case, the thermoelectric inorganic material of the first material layer 10 may be comprised of a plurality of nanoparticles. The thermoelectric inorganic material of the first material layer 10 may include at least one selected from the group consisting of an Sb—Te compound, a Bi—Te compound, a Bi—Sb—Te compound, a Co—Sb compound, a Pb—Te compound, a Ge—Tb compound, an Si—Ge compound, and an Sm—Co compound, for example.

In addition to the above-described thermoelectric inorganic materials, any inorganic material may be used if it is usable in the field of thermoelectric materials. Such a thermoelectric inorganic material may be mixed with the carbon nano-material in the form of nanoparticles to form a composite, and the formed composite may be applied to the first material layer 10. In the case where the carbon nano-material is graphene nanoparticles, the first material layer 10 may be a layer comprised of graphene nanoparticles and thermoelectric inorganic material nanoparticles. Therefore, the first material layer 10 may be a layer comprised of graphene (graphene nanoparticles), or a layer comprised of graphene (graphene nanoparticles) and a thermoelectric inorganic material (thermoelectric inorganic nanoparticles).

The second material layer 20 may be a layer comprised of a thermoelectric inorganic material. The thermoelectric inorganic material of the second material layer 20 may include at least one selected from the group consisting of an Sb—Te compound, a Bi—Te compound, a Bi—Sb—Te compound, a Co—Sb compound, a Pb—Te compound, a Ge—Tb compound, an Si—Ge compound, and an Sm—Co compound, for example. Examples of Sb—Te based thermoelectric inorganic material may include $Sb_2Te_3$, $AgSbTe_2$, $CuSbTe_2$ and the like, examples of Bi—Te based thermoelectric inorganic material may include $Bi_2Te_3$, $(Bi,Sb)_2(Te,Se)_3$ and the like, examples of Co—Sb based thermoelectric inorganic material may include $CoSb_3$ and the like, and examples of Pb—Te based thermoelectric inorganic material may include $PbTe$, $(PbTe)_m AgSbTe_2$ and the like. In addition to the above-described thermoelectric inorganic materials, any inorganic material may be used if it is usable in the field of thermoelectric materials. The thermoelectric inorganic material of the second material layer 20 may be comprised of a plurality of nanoparticles. Therefore, the second material layer 20 may be a layer comprised of thermoelectric inorganic nanoparticles.

The carbon nano-material of the first material layer 10 may be doped with an n-type dopant or a p-type dopant. Also, when the first material layer 10 further includes a thermoelectric inorganic material, the thermoelectric inorganic material may have a property of an n-type semiconductor or a p-type semiconductor. Therefore, the first material layer 10 may have the property of an n-type semiconductor or a p-type semiconductor. The thermoelectric inorganic material of the second material layer 20 may also have the property of an n-type semiconductor or a p-type semiconductor. Meanwhile, the first material layer 10 may have a thickness range of about a few nanometers (nm) to a few hundred micrometers (μm), and the second material layer 20 may have a thickness range of about a few nanometers (nm) to a few hundred micrometers (μm).

By alternately stacking the first material layer 10 containing the carbon nano-material (or the carbon nano-material and the thermoelectric inorganic material) and the second material layer 20 containing the thermoelectric inorganic material, a thermoelectric composite having desirable characteristics may be realized. While the thermoelectric inorganic material has a relatively high Seebeck coefficient, it may have a relatively low electrical conductivity. Meanwhile, the carbon nano-material (e.g., graphene) may have a relatively high charge mobility and a relatively high electrical conductivity. Therefore, the composite obtained by mixing/stacking the thermoelectric inorganic material and the carbon nano-material may have a relatively high Seebeck coefficient, and comparatively improved electrical conductivity and charge mobility. In relation to this, the thermoelectric composite according to an example embodiment may exhibit desirable thermoelectric characteristics.

Also, in the present embodiment, each of the first material layer 10 and the second material layer 20 may be comprised of a plurality of nanoparticles, and in this case, the thermoelectric composite may be easily fabricated and/or productivity thereof may be improved. In the case where the first and second material layers 10 and 20 are formed in the form of a single crystal, an epitaxial process should be used, which may make it difficult to fabricate the thermoelectric composite and may reduce the productivity. However, in example embodiments, since the thermoelectric composite may be fabricated by forming a powder compact without using a crystal growth process such as an epitaxial process, the fabrication process may be easy, the fabrication costs may be low, and mass production may be possible. Here, the powder may be disposed in a liquid (solvent) to divide particles (nanoparticles), and then a film forming process using such particles may be performed. Thus, when the film forming process is performed using the powder dispersed/divided into particles (nanoparticles), effects (a quantum confinement effect, phonon scattering phenomenon, etc.) due to the nanoparticles may be easily obtained. In an example, the stack structure 100 illustrated in FIG. 1 may be fabricated by forming a stack body in which a first layer comprised of graphene nanoparticles (or a mixture of graphene nanoparticles and thermoelectric inorganic nanoparticles) and a second layer comprised of thermoelectric inorganic nanoparticles are alternately stacked via a vacuum filtration process, and then compressing (shaping) the stack body by using a relatively high temperature compression process. In the compressing (shaping) of the stack body, a spark plasma sintering (SPS) process makes it possible to form the stack structure 100 while maintaining the form of nanoparticles. Therefore, each of the first material layer 10 and the second material layer 20 of the stack structure 100 may be comprised of a plurality of nanoparticles. In this case, the quantum confinement effect may be induced and the phonon scattering phenomenon may occur in the first and second material layers 10 and 20 by the nanoparticles, so that the thermoelectric characteristics may be further improved. However, the example embodiments are not limited to the above-mentioned description. That is, at least one of the first and second material layers 10 and 20 may not be comprised of a plurality of nanoparticles. In an example, the first material layer 10 may be comprised of a graphene sheet having a hexagonal crystal structure or may have a structure laminated with a plurality of graphene sheets. Also, the second material layer 20 may be made of a single crystalline thermoelectric inorganic material, or a polycrystalline thermoelectric inorganic material.

Figure 2A:
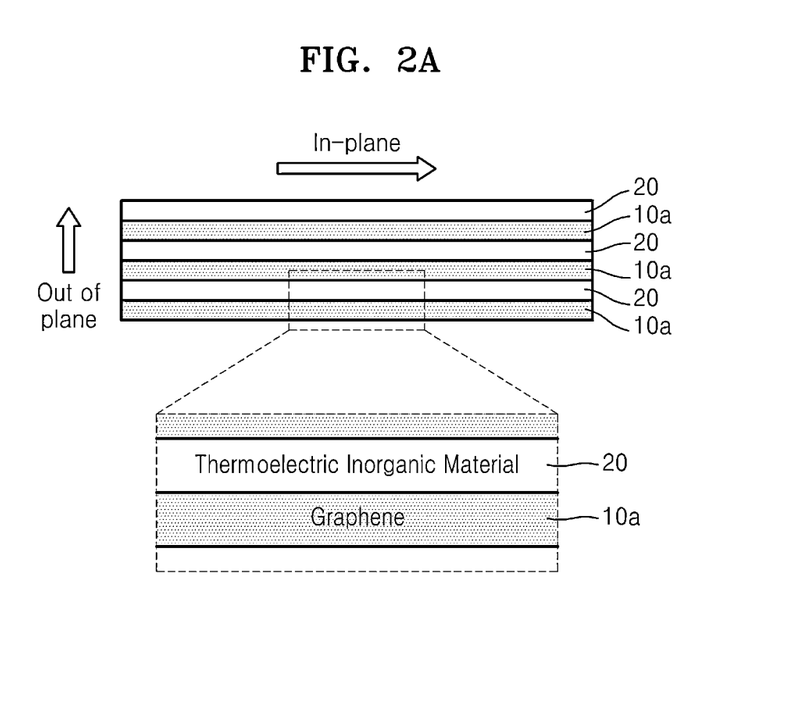
FIGS. 2A and 2B are cross-sectional views illustrating configurations of thermoelectric composites according to an example embodiment.
Figure 2B:
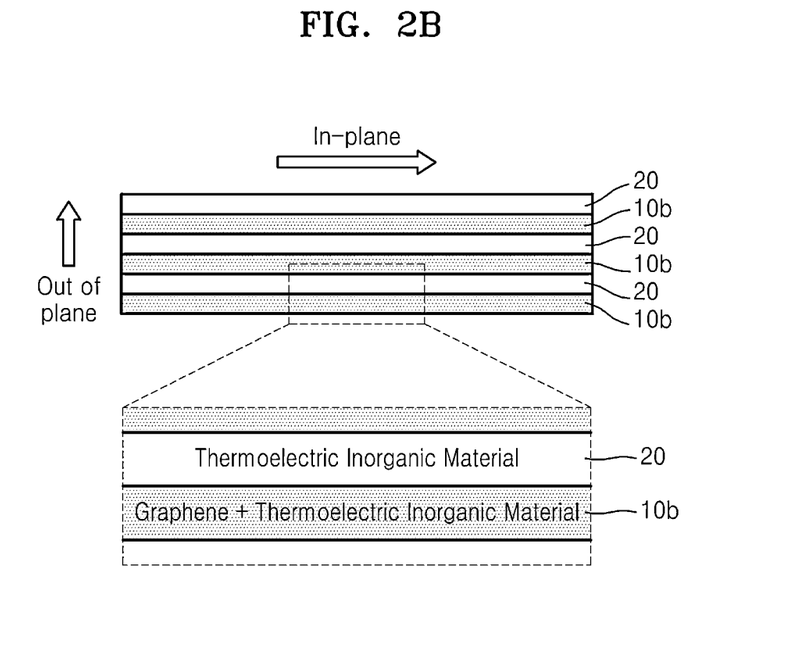

FIGS. 2A and 2B are cross-sectional views illustrating configurations of thermoelectric composites according to an example embodiment.

Referring to FIG. 2A, a first material layer 10a may be formed of graphene (nanoparticles) and the second material layer 20 may be formed of a thermoelectric inorganic material (nanoparticles).

Referring to FIG. 2B, a first material layer 10b may be formed of a composite (mixture) of graphene (nanoparticles) and a thermoelectric inorganic material (nanoparticles), and the second material layer 20 may be formed of a thermoelectric inorganic material (nanoparticles). Herein, the composite of the graphene (nanoparticles) and the thermoelectric inorganic material (nanoparticles) may be a graphene-thermoelectric inorganic hetero composite powder compact synthesized, for example, by microwave solvothermal synthesis or microwave hydrothermal synthesis.

Figure 3:
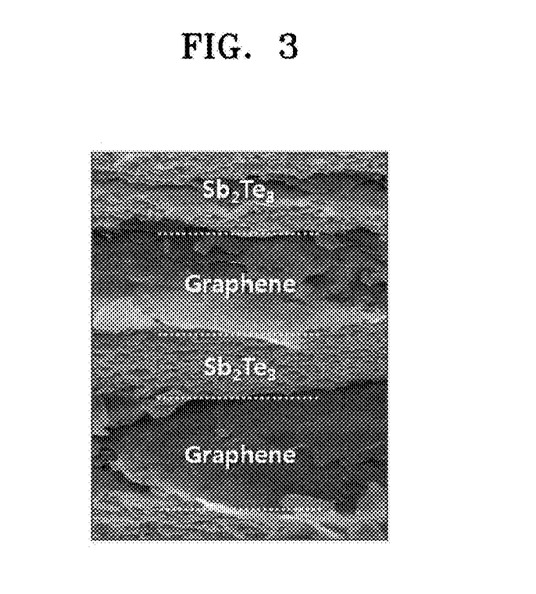
FIG. 3 is a scanning electron microscopic (SEM) image showing a section of a thermoelectric composite according to an example embodiment.

FIG. 3 is a scanning electron microscopic (SEM) image showing a section of a thermoelectric composite according to an example embodiment. The thermoelectric composite of FIG. 3 has the configuration of FIG. 2A. Here, the first material layer 10a is made of graphene (nanoparticles) and the second material layer 20 is made of $Sb_2Te_3$ (nanoparticles) that is a thermoelectric inorganic material.

Figure 4:
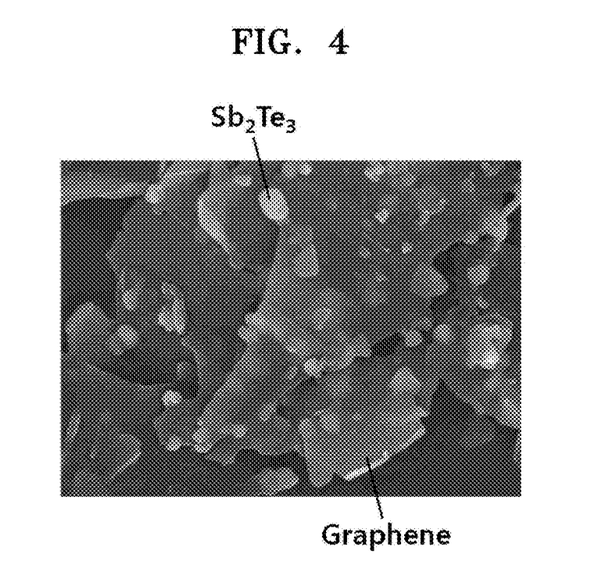
FIG. 4 is an SEM image showing a surface of a graphene-thermoelectric inorganic material composite that may be used in a thermoelectric composite according to an example embodiment.

FIG. 4 is an SEM image showing a surface of a graphene-thermoelectric inorganic material ($Sb_2Te_3$) composite that may be used in a thermoelectric composite according to an example embodiment. In FIG. 4, the particles having a relatively large size are graphene nanoparticles and the particles having a relatively small size are $Sb_2Te_3$ nanoparticles. The composite of FIG. 4 may correspond to the first material layer 10b of FIG. 2B.

Figure 5:
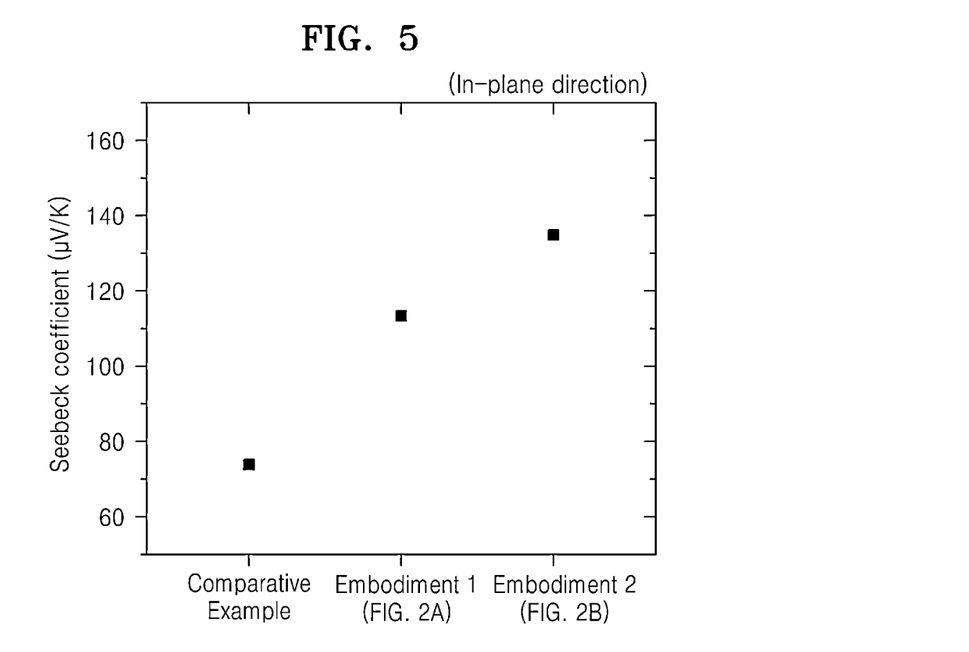
FIG. 5 is a graph showing measurement results of a Seebeck coefficient in an in-plane direction in thermoelectric composites (thermoelectric material) according to example embodiments and a comparative example.

FIG. 5 is a graph showing measurement results of a Seebeck coefficient in an in-plane direction in thermoelectric composites (thermoelectric material) according to example embodiments and a comparative example. Embodiment 1 of FIG. 5 has a structure corresponding to FIG. 2A, and in this case, the first material layer 10a is made of graphene (nanoparticles) and the second material layer 20 is made of $Sb_2Te_3$ (nanoparticles). Embodiment 2 has a structure corresponding to FIG. 2A, and in this case, the first material layer 10b is made of graphene-$Sb_2Te_3$ composite (nanoparticles) and the second material layer 20 is made of $Sb_2Te_3$ (nanoparticles). A thermoelectric structure according to the Comparative Example is entirely made of graphene-$Sb_2Te_3$ composite (nanoparticles). That is, the thermoelectric structure according to the Comparative Example has a single layer structure made of graphene-$Sb_2Te_3$ composite (nanoparticles). In Embodiment 2 and Comparative Example, the graphene-$Sb_2Te_3$ composite (nanoparticles) is formed of graphene-$Sb_2Te_3$ hetero composite powder compact synthesized by microwave solvothermal synthesis.

Referring to FIG. 5, it is shown that the thermoelectric structures (i.e., the structures of FIGS. 2A and 2B) according to Embodiments 1 and 2 have Seebeck coefficients that are about 1.5 times or more than the thermoelectric structure (single layer structure) according to the Comparative Example.

Figure 6:
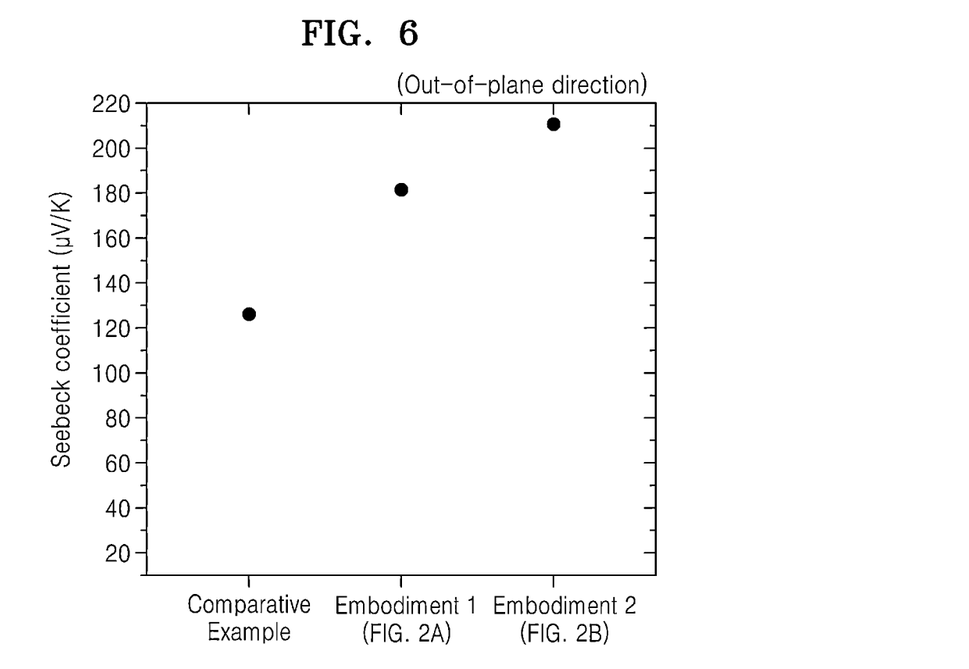
FIG. 6 is a graph showing measurement results of a Seebeck coefficient in an out-of-plane direction in thermoelectric composites (thermoelectric material) according to example embodiments and a comparative example.

FIG. 6 is a graph showing measurement results of a Seebeck coefficient in an out-of-plane direction in thermoelectric composites (thermoelectric material) according to example embodiments and a comparative example. The thermoelectric structures of Embodiments 1 and 2 and the Comparative Example in FIG. 6 are the same as those in FIG. 5.

Referring to FIG. 6, it is shown that the thermoelectric structures (i.e., the structures of FIGS. 2A and 2B) according to Embodiments 1 and 2 have Seebeck coefficients that are about 1.5 times or more than the thermoelectric structure (single layer structure) according to the Comparative Example.

From the results of FIGS. 5 and 6, it may be apparent that when thermoelectric structures are formed with the structures illustrated in FIGS. 2A and 2B according to the example embodiments, the Seebeck coefficient considerably increases in an in-plane direction and an out-of-plane direction.

Figure 7:
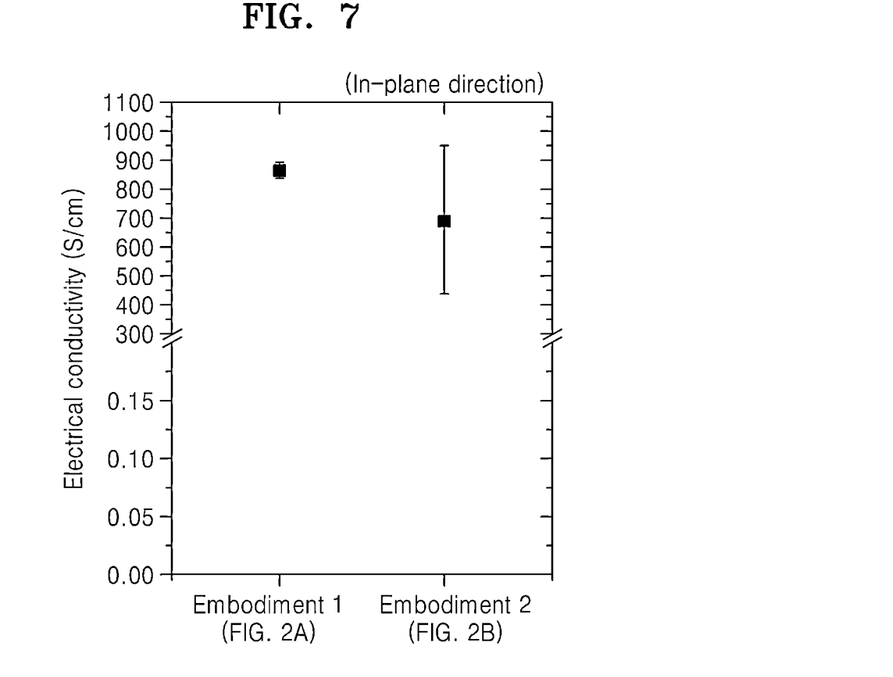
FIG. 7 is a graph showing measurement results of electrical conductivity in an in-plane direction in a thermoelectric composite (thermoelectric material) according to example embodiments.

FIG. 7 is a graph showing measurement results of electrical conductivity in an in-plane direction in a thermoelectric composite (thermoelectric material) according to example embodiments. The thermoelectric structures of Embodiments 1 and 2 in FIG. 7 are the same as those in FIG. 5.

Referring to FIG. 7, it may be apparent that the electrical conductivities of the thermoelectric structures in an in-plane direction according to Embodiments 1 and 2 are about 700-900 S/cm and are comparatively high.

Figure 8:
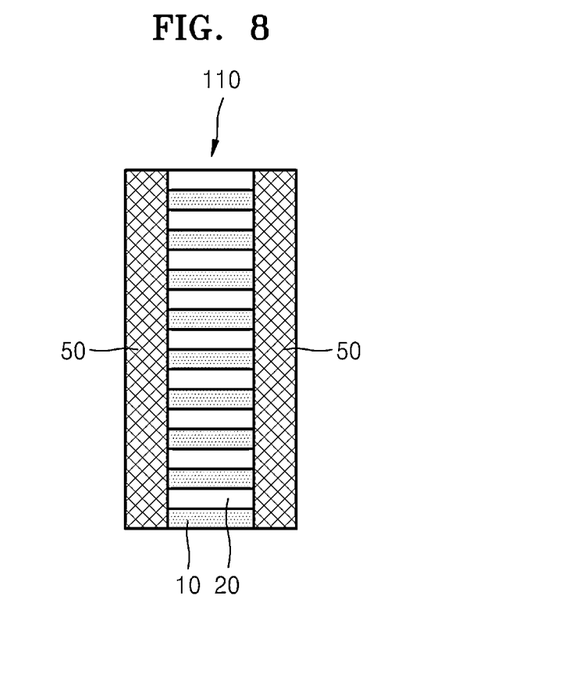
FIG. 8 is a cross-sectional view illustrating a thermoelectric composite according to another example embodiment.

FIG. 8 is a cross-sectional view illustrating a thermoelectric composite according to another example embodiment.

Referring to FIG. 8, a thermoelectric composite according to an embodiment may include a stack structure 110 and at least one conductor 50. The stack structure 110 may be similar to the stack structure 100 of FIG. 1. That is, the stack structure 110 may have a structure in which a first material layer 10 and a second material layer 20 are alternately stacked, and the first and second material layers 10 and 20 may be made of the same materials as the first and second material layers 10 and 20 described with reference to FIG. 1. Therefore, the first material layer 10 may include a carbon nano-material or a carbon nano-material and a thermoelectric inorganic material, and the second material layer 20 may include a thermoelectric inorganic material.

The conductor 50 may extend in an out-of-plane direction of the stack structure 110. The conductor 50 may contact at least one side surface of the first and second material layers 10 and 20. In FIG. 8, it is illustrated that two conductors 50 are disposed spaced apart from each other and the stack structure 110 is disposed therebetween. It may be understood that the conductors 50 are formed along both side surfaces of the stack structure. The conductor 50 may have a pillar shape or a similar shape to the pillar shape.

In an example, the conductor 50 may be a carbon nanotube (CNT). In this case, the conductor 50 may be a multi-walled carbon nanotube (MWCNT). The multi-walled carbon nanotube (MWCNT) is easy to form and may have a comparatively high strength. However, according to circumstances, the conductor 50 may be a single-walled carbon nanotube (SWCNT). When the conductor 50 is a carbon nanotube (CNT), the CNT may directly contact side surfaces of the first and second material layers 10 and 20. Although the present embodiment suggests that an example of the conductor 50 is a carbon nanotube (CNT), the material for the conductor 50 is not limited to the CNT but may be variously variety of other materials. For example, any material may be used as the material for the conductor 50 if it has a higher electrical conductivity than the first and second material layers 10 and 20.

In the case where the conductors 50 are disposed as illustrated in FIG. 8, the electrical conductivity in the stack direction (i.e., the out-of-plane direction) of the thermoelectric composite may be improved by the conductors 50. A performance coefficient of a thermoelectric material, i.e., a figure of merit (ZT) coefficient, is in proportion to the electrical conductivity ($\sigma$) and the Seebeck coefficient (S), and thus, the higher the electrical conductivity the more the thermoelectric characteristics are improved.

Figure 9:
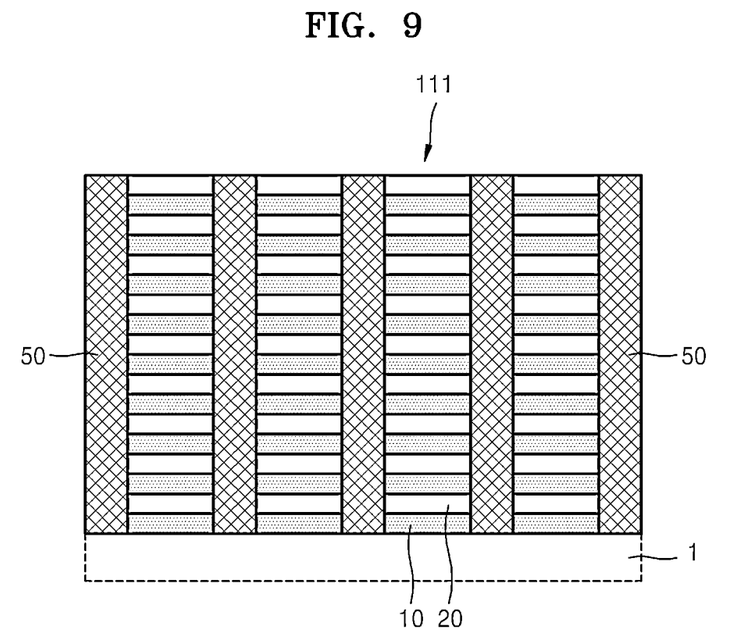
FIG. 9 is a cross-sectional view illustrating a thermoelectric composite according to another example embodiment.

FIG. 9 is a cross-sectional view illustrating a thermoelectric composite according to another example embodiment.

Referring to FIG. 9, a plurality of conductors 50 may be disposed spaced apart from one another, and a stack structure 111 may be disposed therebetween so as to fill spaces therebetween. The plurality of conductors 50, such as a plurality of carbon nanotubes (CNTs) may be grown in a vertical direction (out-of-plane direction) on a substrate 1, and then the stack structure 111 may be formed so as to fill spaces therebetween. The stack structure 111 may be similar to the stack structure 100 of FIG. 1 or the stack structure 110 of FIG. 8. The first and second material layers 10 and 20 constituting the stack structure 111 may be the same as or similar to the first and second material layers 10 and 20 of FIG. 1 (or FIG. 8). The structure of FIG. 9 may be explained in a different way from the above-described way. For example, it may be considered that a plurality of vertical holes are provided in a stack structure 111 and a plurality of conductors 50 are disposed in the plurality of holes, respectively.

Figure 10:
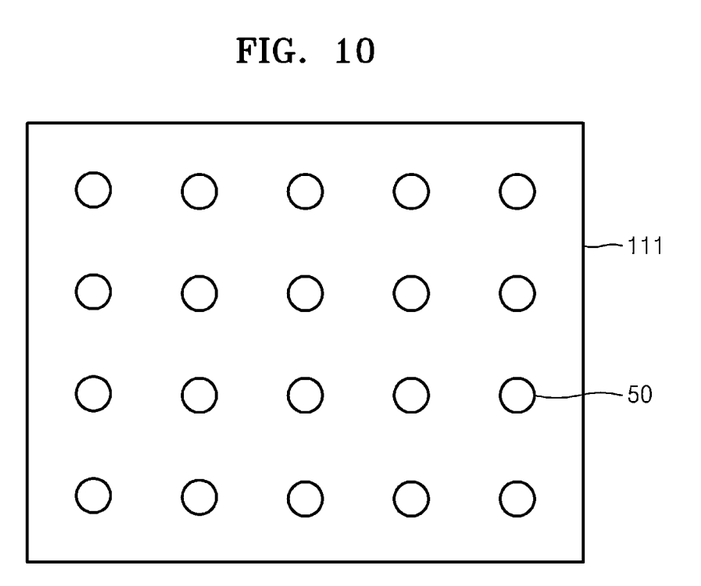
FIG. 10 is a plan view exemplarily illustrating a plan structure of the thermoelectric composite of FIG. 9.

FIG. 10 is a plan view exemplarily illustrating a plan structure of the thermoelectric composite of FIG. 9. Referring to FIG. 10, a plurality of conductors 50 may be disposed spaced apart from one another, and a stack structure 111 may be disposed therebetween so as to fill spaces therebetween. However, the plan structure of FIG. 10 is only exemplary and may be changed in various ways.

By using the thermoelectric composites (thermoelectric materials) described above, various thermoelectric devices may be realized. Hereinafter, thermoelectric devices employing the thermoelectric composites (thermoelectric materials) according to the above-described embodiments will be described.

Figure 11:
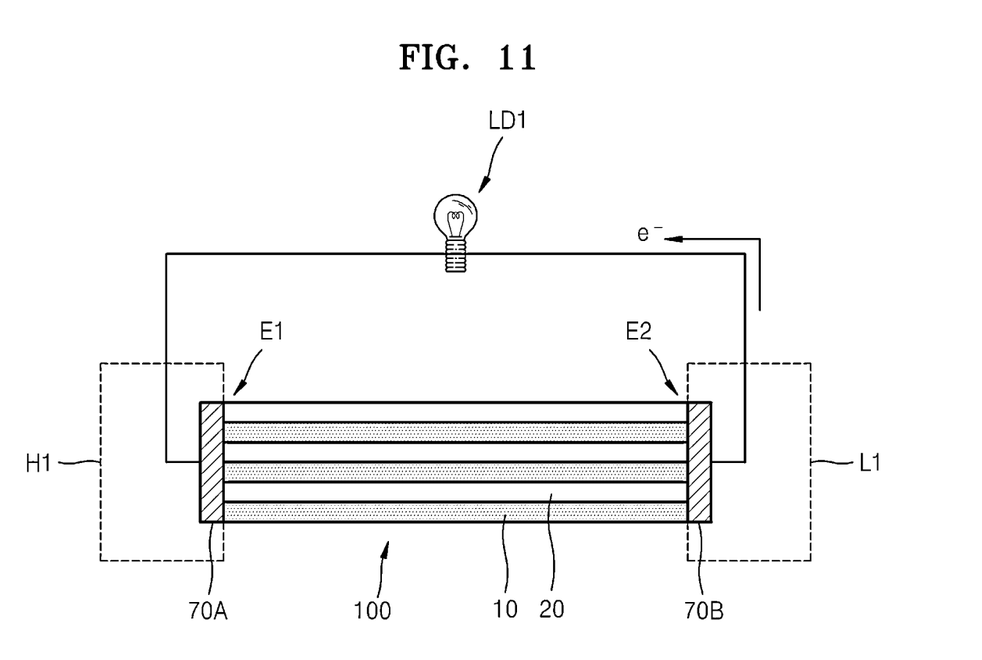
FIG. 11 is a cross-sectional view illustrating a thermoelectric device including a thermoelectric composite (thermoelectric material) according to an example embodiment.

FIG. 11 is a cross-sectional view illustrating a thermoelectric device including a thermoelectric composite (thermoelectric material) according to an example embodiment.

Referring to FIG. 11, a stack structure 100 constituting a thermoelectric composite according to the present embodiment may be connected to a given (or alternatively, predetermined) electronic device, for example, a load device (LD1). The stack structure 100 of FIG. 11 may have the same configuration as the stack structure 100 of FIG. 1, i.e., the configuration in which the first and second material layers 10 and 20 are alternately stacked. The load device LD1 may be an example of "an electricity consuming device" consuming the electricity generated in the stack structure 100. The load device LD1 may be electrically connected to both ends E1 and E2 (i.e., one end E1 and the other end E2) of the stack structure 100 in an in-plane direction. For this purpose, first and second electrodes 70A and 70B may be provided to the one end E1 and the other end E2 of the stack structure 100, respectively, and may be connected to the load device LD1.

The one end E1 of the stack structure 100 may be positioned in a higher temperature region H1 where the temperature is relatively high, and the other end E2 may be positioned in a lower temperature region L1 where the temperature is relatively low. In this case, electricity may be generated from the stack structure 100 by the thermoelectric effect. For example, electrons (e–) (or holes) may move from the one end E1 positioned in the higher temperature region H1 to the other end E2 positioned at the lower temperature region L1. Electrons (e–) (or holes) may flow to the load device LD1. Since the stack structure 100 may have a comparatively high electrical conductivity in the in-plane direction, current may easily flow through the stack structure 100. Also, the stack structure 100 may have a relatively high Seebeck coefficient. Therefore, the thermoelectric device according to the present embodiment may exhibit desirable thermoelectric characteristics.

According to another example embodiment, the load device LD1 of FIG. 11 may be replaced by a unit for storing electricity, i.e., "electricity storing device" such as a storage battery. In this case, the electricity generated in the stack structure 100 may be stored in the electricity storing device.

Although FIG. 11 illustrates and describes an example in which a thermoelectric electricity generation device is realized using the stack structure 100, a thermoelectric cooling device may be also realized using the stack structure 100. Such an example is illustrated in FIG. 12.

Figure 12:
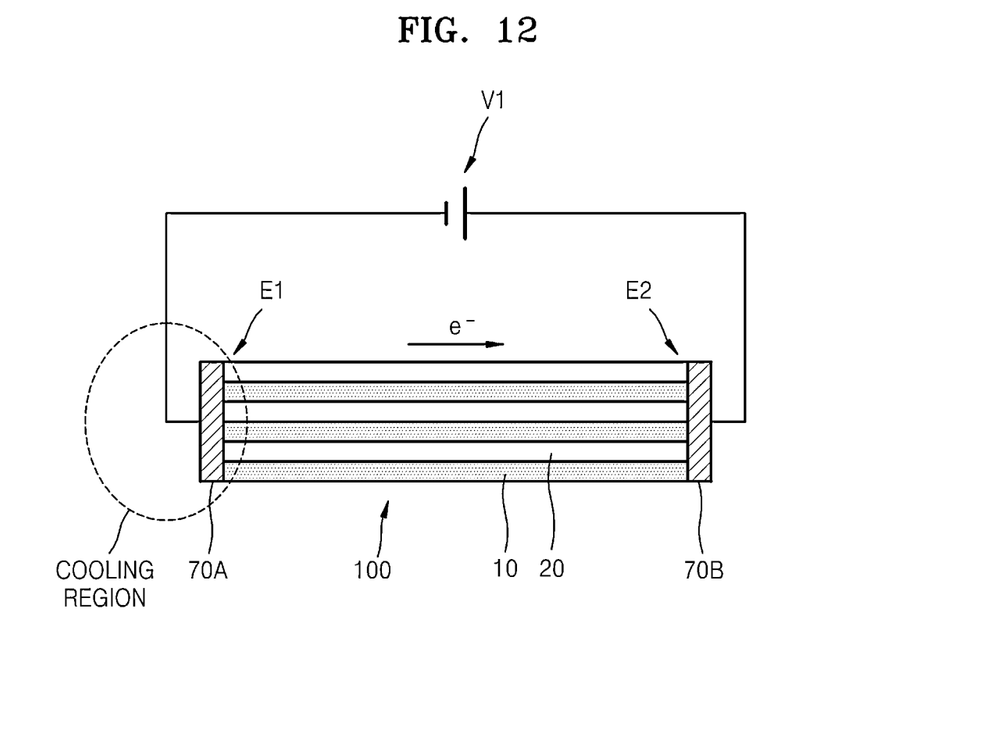
FIG. 12 is a cross-sectional view illustrating a thermoelectric device including a thermoelectric composite (thermoelectric material) according to another example embodiment.

Referring to FIG. 12, a power source V1 may be connected to both ends E1 and E2 of a stack structure 100 in an in-plane direction. When current is supplied to the stack structure 100 from the power source V1, one end E1 of the stack structure 100 may absorb surrounding heat by the Peltier effect. Thus, the one end E1 of the stack structure 100 and a neighboring region thereof may be cooled. The power source V1 is an example of an electricity supply device, and a configuration thereof may be changed in various ways. The device of FIG. 12 and a device modified therefrom may be used for reducing heat generated in, for example, an electric circuit, a vehicle engine, etc.

Although FIGS. 11 and 12 illustrate and describe that an electronic device (LD1, V1, etc.) is connected to both ends E1 and E2 of the stack structure 100 in the in-plane direction in the design of the thermoelectric devices, a thermoelectric device may be realized by connecting an electronic device to both ends of the stack structure 100 in an out-of-plane direction. Such examples are illustrated in FIGS. 13 and 14.

Figure 13:
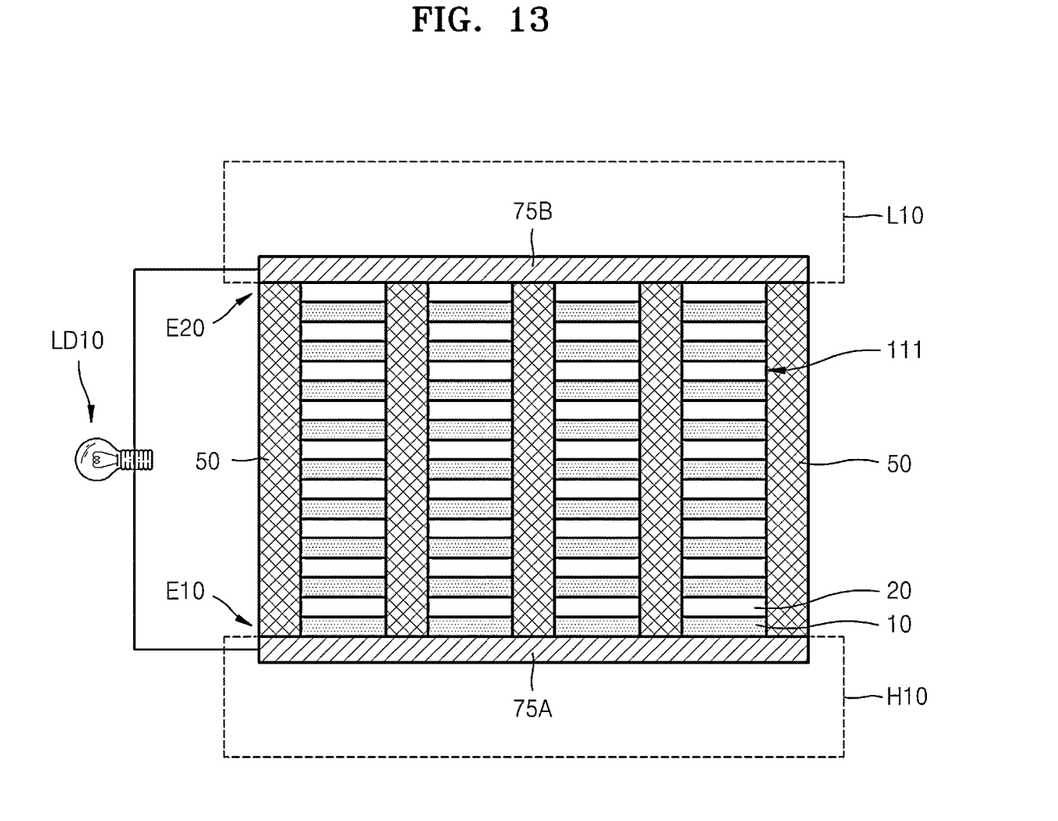
FIG. 13 is a cross-sectional view illustrating a thermoelectric device including a thermoelectric composite (thermoelectric material) according to another example embodiment.

FIG. 13 is a cross-sectional view illustrating a thermoelectric device including a thermoelectric composite (thermoelectric material) according to another example embodiment. The thermoelectric device of FIG. 13 includes the thermoelectric composite illustrated in FIG. 9.

Referring to FIG. 13, a thermoelectric composite including the stack structure 111 and the conductors 50 may be prepared, and first and second electrodes 75A and 75B may be provided to both ends E10 and E20 of the thermoelectric composite in an out-of-plane direction thereof. The first and second electrodes 75A and 75B may be connected to a given (or alternatively, predetermined) electronic device, for example, a load device LD10. The load device LE10 may be the same as that described with reference to FIG. 11. The one end E10 of the thermoelectric composite may be positioned in a higher temperature region H10 where the temperature is relatively high, and the other end E20 may be positioned in a lower temperature region L10 where the temperature is relatively low. In this case, electricity may be generated from the stack structure 111 by the thermoelectric effect. Since the electrical conductivity of the thermoelectric composite may be improved by the conductors 50 contacting the stack structure 111 and the stack structure 111 may have a relatively high Seebeck coefficient, the thermoelectric device of the present embodiment may exhibit desirable thermoelectric characteristics. The thermoelectric device of FIG. 13 may be a thermoelectric electricity generation device similar to the thermoelectric device of FIG. 11. According to another example embodiment, the load device LD10 of FIG. 13 may be replaced by a unit for storing electricity, i.e., "electricity storing device", such as a storage battery.

Figure 14:
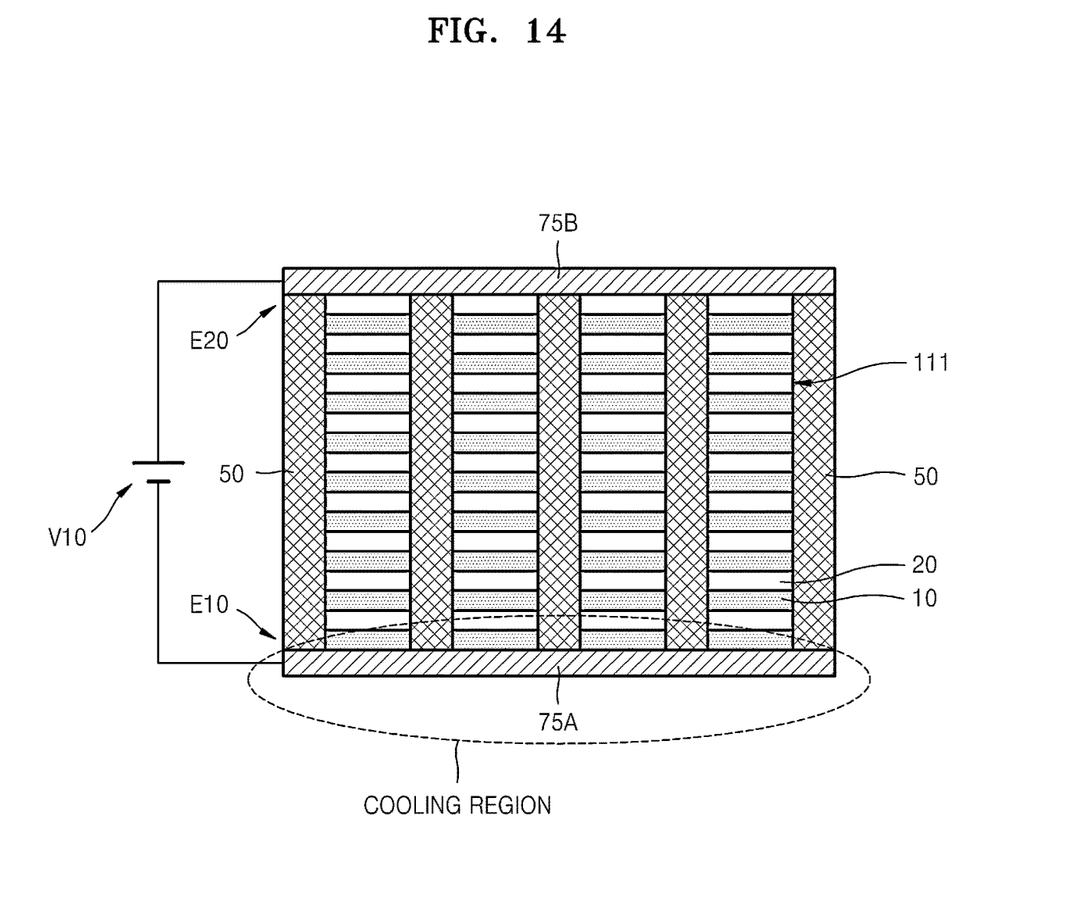
FIG. 14 is a cross-sectional view illustrating a thermoelectric device including a thermoelectric composite (thermoelectric material) according to another example embodiment.

FIG. 14 is a cross-sectional view illustrating a thermoelectric device including a thermoelectric composite (thermoelectric material) according to another example embodiment. The embodiment of FIG. 14 illustrates an example of a thermoelectric cooling device including the thermoelectric composite illustrated in FIG. 9.

Referring to FIG. 14, first and second electrodes 75A and 75B may be disposed at both ends E10 and E20 of a thermoelectric composite in an out-of-plane direction thereof, and a power source V10 may be connected to the first and second electrodes 75A and 75B. When current is supplied to the stack structure 111 from the power source V10, one end E10 of the thermoelectric composite may absorb surrounding heat by the Peltier effect. That is, surrounding heat may be absorbed at the one end E10 of the thermoelectric composite by the stack structure 111. Thus, the one end E10 and a surrounding region of the thermoelectric composite may be cooled. The power source V10 is an example of an electricity supply device, and a configuration thereof may be changed variously.

Basic configurations of the thermoelectric devices including the thermoelectric composites (thermoelectric materials) according to example embodiments have been described with reference to FIGS. 11 through 14. By modifying the basic configurations in FIGS. 11 through 14, various thermoelectric devices may be realized. These modifications and applications may be well known to a person of ordinary skill in the art, and thus detailed descriptions thereof will be omitted here. In addition, although not illustrated in the drawings, the thermoelectric devices according to the example embodiments may be used as heat sensors. The basic configurations of such heat sensors are well known to a person of ordinary skill in the art, and thus detailed descriptions thereof will be omitted here.

While embodiments have been described above, they should be construed not as limiting the scope of the inventive concepts but as merely examples. For example, it will be understood by those of ordinary skill in the art that various changes in the configurations of the thermoelectric composites illustrated in FIGS. 1, 2A, 2B and 8 through 10, and the configurations of the thermoelectric devices illustrated in FIGS. 11 through 14 may be made. In an example, a thermoelectric composite according to an example embodiment may be configured to further include a third material layer in addition to the first and second material layers 10 and 20. Also, a given (or alternatively, predetermined) module may be configured by connecting a plurality of thermoelectric composites in series or in parallel, and a thermoelectric device employing such a module may be configured. Additionally, various changes/applications in form and details may be made. Therefore, the scope of the inventive concepts is defined not by the detailed description of the inventive concepts but by the technical spirits set forth in the appended claims.

It should be understood that the example embodiments described herein should be considered in a descriptive sense only and not for purposes of limitation. Descriptions of features or aspects within each embodiment should typically be considered as available for other similar features or aspects in other embodiments.

What is claimed is:

1. A thermoelectric composite comprising:
   a stack structure including alternately stacked at least two first and at least two second material layers, the at least two first material layers containing a carbon nano-material and the at least two second material layers containing a thermoelectric inorganic material, and
   at least one conductor extending in an out-of-plane direction of the at least two first and the at least two second material layers, the at least one conductor directly contacting a lateral side surface of each of the at least two first and the at least two second material layers, the at least one conductor being configured to connect the lateral side surfaces of at least two first and the at least two second material layers in the out-of-plane direction,
   wherein the carbon nano-material includes a plurality of graphene nanoparticles, the plurality of graphene nanoparticles are nanoscale particles, at least some of the plurality of graphene nanoparticles are arranged in an in plane direction of the at least two first material layers, and the plurality of graphene nanoparticles collectively form a layer structure,
   wherein adjacent two layers in the stack structure are in direct contact with each other in the out-of-plane direction, and
   wherein each of the at least two first and the at least two second material layers has a length in the in-plane direction of the at least two first material layers and a thickness in the out-of-plane direction of the at least two first material layers, the length is greater than the thickness, the at least one conductor extends in the out-of-plane direction, and the at least one conductor directly contacts the at least two first material layers and the at least two second material layers.

2. The thermoelectric composite of claim 1, wherein the at least two first material layers further comprise a thermoelectric inorganic material.

3. The thermoelectric composite of claim 2, wherein the thermoelectric inorganic material of the at least two first material layers include a plurality of nanoparticles.

4. The thermoelectric composite of claim 2, wherein at least two first material layers comprise a composite of the carbon nano-material and the thermoelectric inorganic material.

5. The thermoelectric composite of claim 1, wherein the thermoelectric inorganic material of the at least two second material layers includes a plurality of nanoparticles.

6. The thermoelectric composite of claim 1, wherein the thermoelectric inorganic material of the at least two second material layers include at least one of an Sb—Te compound, a Bi—Te compound, a Bi—Sb—Te compound, a Co—Sb compound, a Pb—Te compound, a Ge—Tb compound, an Si—Ge compound, and an Sm—Co compound.

7. The thermoelectric composite of claim 1, wherein the at least one conductor has a pillar shape.

8. The thermoelectric composite of claim 1, wherein the at least one conductor comprises a carbon nanotube (CNT).

9. The thermoelectric composite of claim 8, wherein the at least one conductor comprises a multi-walled carbon nanotube (MWCNT).

10. The thermoelectric composite of claim 8, wherein the at least one conductor comprises a single-walled carbon nanotube (SWCNT).

11. The thermoelectric composite of claim 1, wherein
the at least one conductor comprises a plurality of conductors spaced apart from each other, and
the stack structure fills a space between the plurality of conductors.

12. A thermoelectric device comprising the thermoelectric composite of claim 1.

13. The thermoelectric device of claim 12, further comprising:
an electronic device connected to both ends of the stack structure in an in-plane direction of the stack structure.

14. The thermoelectric device of claim 13, wherein the electronic device is one of an electricity consuming device, an electricity storing device, and an electricity supplying device.

15. The thermoelectric device of claim 12, further comprising:
an electronic device electrically connected to both ends of the stack structure in an out-of-plane direction of the stack structure.

16. The thermoelectric device of claim 15, wherein the electronic device is one of an electricity consuming device, an electricity storing device, and an electricity supplying device.

17. The thermoelectric device of claim 12, wherein the thermoelectric device is one of a thermoelectric electricity generation device, a thermoelectric cooling device, and a heat sensor.

18. A thermoelectric device comprising:
a thermoelectric material having a stack structure including alternately stacked at least two first and at least two second material layers, the at least two first material layers containing a carbon nano-material and the at least two second material layers containing a thermoelectric inorganic material, and at least one of the carbon nano-material and the thermoelectric inorganic material including a plurality of graphene nanoparticles, and
at least one conductor extending along lateral side surfaces of the at least two first and the at least two second material layers, the at least one conductor directly contacting the lateral side surface of each of the at least two first and the at least two second material layers, the at least one conductor being configured to connect the lateral side surfaces of the at least two first and the at least two second material layers,
wherein the plurality of graphene nanoparticles are nanoscale particles, at least some of the plurality of graphene nanoparticles are arranged in an in-plane direction of the at least two first material layers, and the plurality of graphene nanoparticles collectively form a layer structure,
wherein adjacent two layers in the stack structure are in direct contact with each other in an out-of-plane direction, and
wherein each of the at least two first and the at least two second material layers has a length in the in-plane direction of the at least two first material layers and a thickness in the out-of-plane direction, the length is greater than the thickness, the at least one conductor extends in the out-of-plane direction, and the at least one conductor directly contacts the at least two first material layers and the at least two second material layers.

19. The thermoelectric device of claim 18, wherein the at least two first material layers comprises a composite of the carbon nano-material and a thermoelectric inorganic material.

20. The thermoelectric device of claim 18, wherein the at least one conductor comprises a carbon nanotube (CNT).

21. The thermoelectric device of claim 18, wherein
the at least one conductor comprises a plurality of conductors spaced apart from each other, and
the stack structure fills a space between the plurality of conductors.

* * * * *